US007193255B2

(12) United States Patent
Asano

(10) Patent No.: US 7,193,255 B2
(45) Date of Patent: Mar. 20, 2007

(54) SEMICONDUCTOR DEVICE WITH FLOATING CONDUCTING REGION PLACED BETWEEN DEVICE ELEMENTS

(75) Inventor: Tetsuro Asano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/138,650

(22) Filed: May 27, 2005

(65) Prior Publication Data

US 2005/0263796 A1    Dec. 1, 2005

(30) Foreign Application Priority Data

May 28, 2004    (JP)    ............... 2004-158564

(51) Int. Cl.
*H01L 29/80*    (2006.01)
*H01L 31/112*    (2006.01)
*H01L 29/76*    (2006.01)
*H01L 29/94*    (2006.01)
*H01L 31/062*    (2006.01)
*H01L 31/113*    (2006.01)
*H01L 31/119*    (2006.01)

(52) U.S. Cl. ............ 257/275; 257/280; 257/289; 257/401; 257/490; 257/E29.111

(58) Field of Classification Search ............ 257/488, 257/489, 490, E29.111, 275, 280, 289, 401
See application file for complete search history.

(56) References Cited

U.S. PATENT DOCUMENTS 4,707,719 A * 11/1987 Whight ............ 257/489

| | | | | |
|---|---|---|---|---|
| 5,510,634 A * | 4/1996 | Okabe et al. | ............ | 257/139 |
| 6,495,866 B2 * | 12/2002 | Kawamoto | ............ | 257/175 |
| 6,828,645 B2 * | 12/2004 | Jimbo et al. | ............ | 257/488 |
| 6,870,201 B1 * | 3/2005 | Deboy et al. | ............ | 257/170 |
| 2002/0030199 A1 * | 3/2002 | Hirano et al. | ............ | 257/121 |
| 2002/0047177 A1 | 4/2002 | Asano et al. | | |
| 2002/0050603 A1 * | 5/2002 | Kawamoto | ............ | 257/175 |
| 2002/0140024 A1 | 10/2002 | Aoki et al. | | |
| 2002/0171093 A1 * | 11/2002 | Onishi et al. | ............ | 257/197 |

(Continued)

FOREIGN PATENT DOCUMENTS

JP    09-181642    7/1997

(Continued)

OTHER PUBLICATIONS

WordNet 2.0, 2003 Princeton University. (from http://dictionary.reference.com).

*Primary Examiner*—Ngân V. Ngô
(74) *Attorney, Agent, or Firm*—Morrison & Foerster LLP

(57) ABSTRACT

Floating conducting regions at floating potentials are placed on a substrate surface between adjacent conducting regions to which predetermined potentials are applied. This makes it possible to block the spread of a depletion layer to the substrate between the conducting impurity regions. Thus, the leakage of high-frequency signals can be suppressed. In particular, in a case where a floating conducting region is placed between a peripheral impurity region of a common input terminal pad and a resistor in a switch circuit device, it is possible to suppress the leakage of high-frequency signals from an input terminal to control terminals which become high frequency GND and to suppress an increase in insertion loss.

12 Claims, 11 Drawing Sheets

U.S. PATENT DOCUMENTS

| | | |
|---|---|---|
| 2002/0195613 A1* | 12/2002 | Andoh et al. ............... 257/121 |
| 2003/0025154 A1* | 2/2003 | Haynie ...................... 257/335 |
| 2003/0067033 A1* | 4/2003 | Kinoshita et al. ........... 257/328 |
| 2003/0222327 A1* | 12/2003 | Yamaguchi et al. ........ 257/500 |
| 2004/0065921 A1* | 4/2004 | Iwamoto et al. ............ 257/341 |
| 2004/0077305 A1* | 4/2004 | Andoh et al. .................. 455/1 |
| 2005/0056912 A1* | 3/2005 | Ninomiya et al. .......... 257/565 |
| 2005/0098826 A1* | 5/2005 | Yamaguchi et al. ........ 257/341 |
| 2005/0242411 A1* | 11/2005 | Tso ............................ 257/480 |

FOREIGN PATENT DOCUMENTS

| | | |
|---|---|---|
| JP | 2002-368194 | 12/2002 |
| JP | 2004-134589 A | 4/2004 |
| JP | 2004-254086 | 9/2004 |
| KR | 10-0589094 B1 | 6/2006 |

* cited by examiner

Prior Art

Prior Art

SEMICONDUCTOR DEVICE WITH FLOATING CONDUCTING REGION PLACED BETWEEN DEVICE ELEMENTS

BACKGROUND OF THE INVENTION

1. Field of the Invention

The present invention relates to a semiconductor device. In particular, the present invention relates to a semiconductor device in which insertion loss is reduced.

2. Description of the Related Art

In mobile communication devices including mobile phones, microwaves in the GHz band are often used, and switch elements for switching high-frequency signals are often used for antenna switch circuits and transmitting/receiving switch circuits (e.g., Japanese Patent Application Publication No. Hei 9(1997)-181642). Since such elements deal with high frequencies, field effect transistors (hereinafter referred to as FETs) using gallium arsenide (GaAs) are often used as such elements. Along with this, monolithic microwave integrated circuits (MMICs) are being developed into which a switch circuit itself, such as described above, is integrated.

FIGS. 10A and 10B show circuit diagrams of compound semiconductor switch circuit devices using GaAs FETs and called a single-pole double-throw (SPDT) switch.

FIG. 10A is a fundamental circuit diagram. The sources (or drains) of first and second FETs FET1 and FET2 are connected to a common input terminal IN. The gates of the FET1 and FET2 are connected to first and second control terminals Ctl-1 and Ctl-2 through resistors R1 and R2, respectively. Further, the drains (or sources) of the FETs are connected to first and second output terminals OUT1 and OUT2, respectively. Signals which are applied to the first and second control terminals Ctl-1 and Ctl-2 are complementary signals. Of the FETs, one to which an H-level signal is applied is turned on, whereby a high-frequency signal entering the input terminal IN is transmitted to either one of the output terminals. The resistors R1 and R2 are placed in order to prevent high-frequency signals from leaking through the gate electrodes to the DC potentials of the control terminals Ctl-1 and Ctl-2 which are AC grounded.

In the logic of the switch circuit shown in FIG. 10A, when a high-frequency signal is passed to the output terminal OUT1, a voltage of, for example, 3 V is applied to the control terminal Ctl-1 close to the output terminal OUT1, and a voltage of 0 V is applied to the control terminal Ctl-2. On the other hand, when a high-frequency signal is passed to the output terminal OUT2, a voltage of 3 V is applied to the control terminal Ctl-2 close to the output terminal OUT2, and a bias signal of 0 V is applied to the control terminal Ctl-1. However, depending on user demands, the inverse logic thereof needs to be constructed.

FIG. 10B shows the circuit configuration of the compound semiconductor switch circuit device where a logic pattern is reverse of one of FIG. 10A.

In this circuit, the gate of the FET1 is connected to the control terminal Ctl-1 located far from the FET1 through the resistor R1, and the gate of the FET2 is connected to the control terminal Ctl-2 located far from the FET2 through the resistor R2. In this configuration, when a signal is passed to the output terminal OUT1, a voltage of, for example, 3 V is applied to the control terminal Ctl-1 far from the output terminal OUT1, and a voltage of 0 V is applied to the control terminal Ctl-2. On the other hand, when a signal is passed to the output terminal OUT2, a voltage of 3 V is applied to the control terminal Ctl-2 far from the output terminal OUT2, and a bias signal of 0 V is applied to the control terminal Ctl-1.

FIGS. 11A and 11B show one example of a compound semiconductor chip into which a switch circuit of a reverse control type in the compound semiconductor switch circuit device shown in FIG. 10B is integrated. FIG. 11A is a plan view, and FIG. 11B is a cross-sectional view taken along the d—d line of FIG. 11A.

The FET1 and FET2 are placed in a central portion of a GaAs substrate. The resistors R1 and R2 are connected to gate electrodes 17 of the FETs. Further, pads I, O1, O2, C1, and C2, which respectively correspond to the common input terminal IN, the output terminals OUT1 and OUT2, and the control terminals Ctl-1 and Ctl-2, are provided around the FET1 and FET2 in the periphery of the substrate.

Incidentally, a Schottky metal layer indicated by dotted lines is a gate metal layer (Ti/Pt/Au) 20 which is formed simultaneously with the formation of the gate electrodes 17 of the FETs, and a wiring metal layer indicated by a solid line is a pad metal layer (Ti/Pt/Au) 30 which connects elements and which forms the pads. An ohmic metal layer (AuGe/Ni/Au) is ohmically connected to the substrate, and forms the source and drain electrodes of the FETs and extraction electrodes at both ends of the resistors. In FIG. 11A, the ohmic metal layer is not shown because it is overlapped by the pad metal layer.

Operating regions 12 are impurity regions indicated by dashed—dotted lines. In each of the operating region 12, source and drain regions are placed which are heavily-doped impurity regions. Source and drain electrodes 15 and 16 are connected to the source and drain regions. A gate electrode 17 forms a Schottky contact to the surface of the operating region 12. Further, comb-tooth shaped portions of the gate electrode 17 are bundled into a gate wiring 27 outside the operating region 12 and connected to a resistor.

In this case, the common input terminal pad I is a common pad of the two FETs FET1 and FET2, and each of the control terminal pads C1 and C2 is connected to the FET located far from itself. Further, the resistors R1 and R2, which are connections therebetween, are placed in parallel between the common input terminal pad I and the FETs. This technology is described for instance in Japanese Patent Application Publication No. 2002-368194.

As described above, in the switch circuit device of FIGS. 11A and 11B, in order to construct a switch circuit of a reverse control type, the resistors R1 and R2 are extended in the chip to be placed in parallel between the common input terminal pad I and the FETs.

Moreover, as show in FIG. 11B, in order to suppress the spread of depletion layers from the pads or the gate wirings 27, n+ type peripheral impurity regions 40 are provided in the peripheries of regions under the pads and the peripheries of regions under the gate wirings 27. Further, the resistors R1 and R2 are also made of n+ type impurity regions which are heavily-doped regions. Additionally, an opening is made in a nitride film 60, and the common input terminal pad I is provided. The distances between adjacent portions of the n+ type impurity region 40 under the common input terminal pad I and the resistors R1 and R2 are 4 µm each other.

This is because experimentally obtained data shows that when the distance between adjacent n+ type impurity regions is 4 µm or more in a compound semiconductor switch circuit device using GaAs FETs, isolation is 20 dB or more, that is, the isolation therebetween is ensured to be sufficient.

Thus, the resistors R1 and R2 can be placed in parallel between the common input terminal pad I and the FETs. Additionally, the resistors R1 and R2 and the common input terminal pad I can be closely placed at a distance of 4 µm from each other. Accordingly, an enlargement of the chip can be suppressed even if the chip has a reverse control pattern.

Here, the above-described switch circuit device has a pattern of FETs in which the operating regions 12 are formed by ion implantation of impurities into the GaAs substrate. This pattern can also be applied to the case of High Electron Mobility Transistors (HEMTs) in which the substrate structure is different.

However, when a switch circuit device was constructed in the same pattern as that of the above-described one using HEMTs instead of the GaAs FETs, it was revealed that insertion loss increased, which is loss in the transmission of a high-frequency signal from the common input terminal IN to the output terminal OUT1. This is because a pattern was adopted in which the distance between adjacent portions of the n+ type impurity region 40 under the common input terminal pad I and the resistor R1 is 4 µm.

The reason for this may be explained as follows: in the reverse control pattern, the resistor R1 extended from the control terminal pad C1 is located close to the common input terminal pad I; accordingly, part of an input high-frequency signal entering the common input terminal IN leaks through the n+ type impurity region 40 and the resistor R1 to the control terminal Ctl-1 which is at a GND potential at high frequencies.

That is, since the insertion loss of a HEMT is significantly small compared to that of a GaAs FET, an addition of insertion loss due to the aforementioned pattern shape, which addition was not observed in an MMIC using GaAs FETs, became apparent in an MMIC using HEMTs. The MMIC using GaAs FETs also potentially has an addition of insertion loss due to the aforementioned pattern shape by an amount similar to that in the MMIC using HEMTs. However, the addition of insertion loss was not observed, because the insertion loss of a GaAs FET itself is large and the proportion of the addition of insertion loss is negligible.

SUMMARY OF THE INVENTION

The present invention provides a semiconductor device that includes a compound semiconductor substrate; an operating region disposed in or on the substrate; a first metal layer configured to receive a first predetermined electric potential and connected with the operating region; a conducting region disposed in or on the substrate; a second metal layer configured to receive a second predetermined electric potential and connected with the conducting region; and a floating conducting region disposed in or on the substrate, the floating conducting region being configured not to receive any electric potential and disposed between the operating region and the conducting region.

The present invention also provides a semiconductor device that includes a compound semiconductor substrate; a first conducting region disposed in or on the substrate; a first metal layer configured to receive a first predetermined electric potential and connected with the first conducting region; a second conducting region disposed in or on the substrate; a second metal layer configured to receive a second predetermined electric potential and connected with the second conducting region; and a floating conducting region disposed in or on the substrate, the floating conducting region being configured not to receive any electric potential and disposed between the first and second conducting regions.

The present invention further provides a semiconductor device that includes a compound semiconductor substrate; a first field effect and a second field effect transistor, each of the transistors being formed on the substrate and comprising an operating region and a gate electrode, a source electrode and a drain electrode that are connected with the operating region; a common input terminal pad connected with the source or drain electrode of the first transistor and connected with the source or drain electrode of the second transistor; a first output terminal pad connected with the source or drain electrode of the first transistor that is not connected with the common input terminal pad; a second output terminal pad connected with the source or drain electrode of the second transistor that is not connected with the common input terminal pad; a first control terminal pad; a first electric connection connecting the first control terminal pad and the gate electrode of the first transistor; a second control terminal pad; a second electric connection connecting the second control terminal pad and the gate electrode of the second transistor; a conducting region disposed in or on the substrate that is in electric contact with one of the common input terminal pad, the first and second output terminal pads and the first and second control terminal pads, or a wiring connected with one of the common input terminal pad, the first and second output terminal pads and the first and second control terminal pads, or a wiring connected with one of the operating regions; and floating conducting region that is configured not to receive any electric potential, the floating conducting region being disposed between one of the operating regions and the conducting region, between the operating region of the first transistor and the operating region of the second transistor, between one of the first and second electric connections and one of the operating regions, between the first and second electric connections or between the common input terminal pad and one of the first and second electric connections.

DESCRIPTION OF THE PREFERRED EMBODIMENTS

Figure 1:
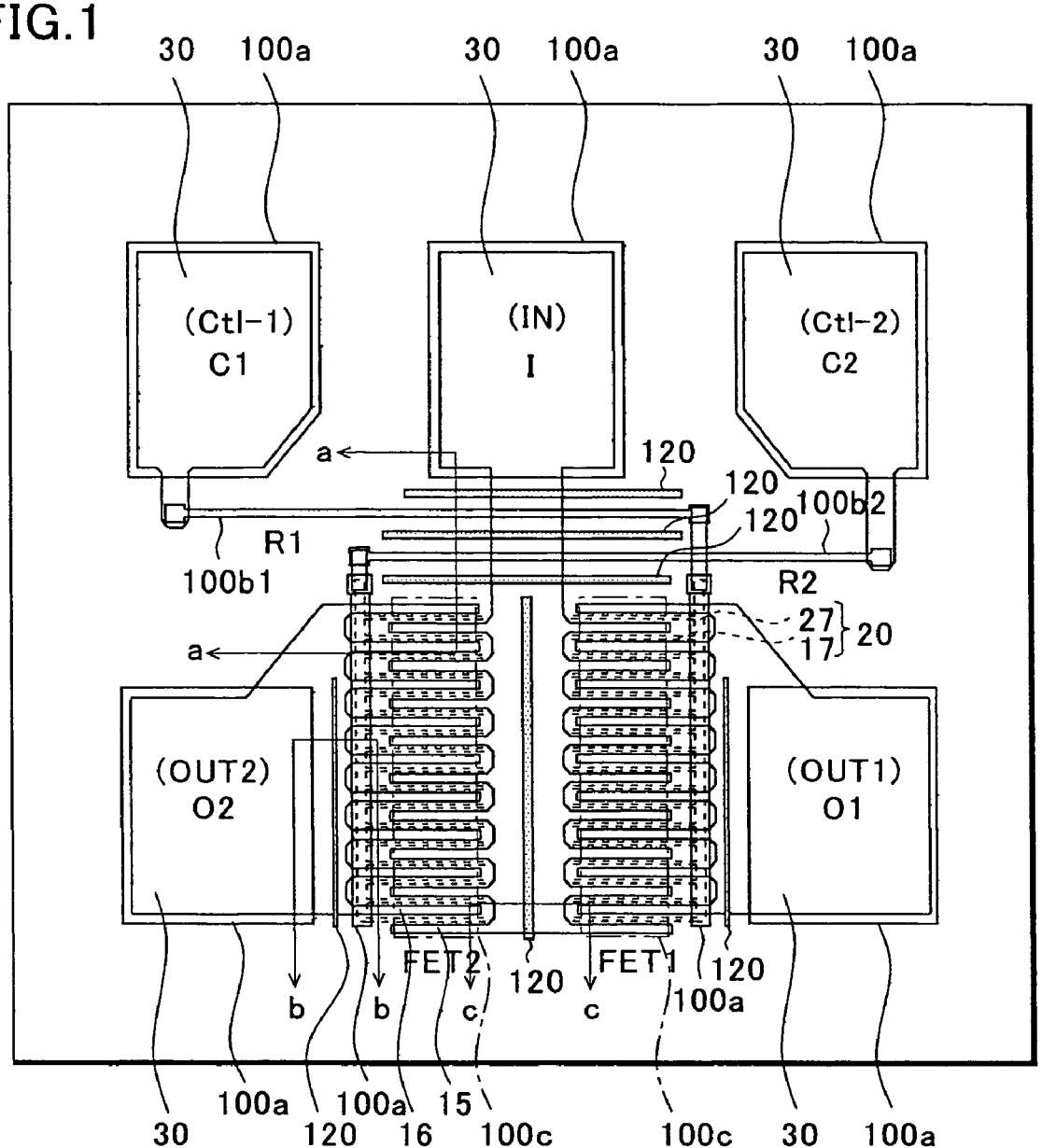
FIG. 1 is a plan view for explaining a first embodiment of the present invention.

Hereinafter, embodiments of the present invention will be described in detail. Note that the same components as those of the conventional technology are denoted by the same reference numerals.

First, using FIGS. 1 to 2C, a first embodiment of the present invention will be described by taking as an example an SPDT switch circuit device using GaAs MESFETs.

Figure 10A:
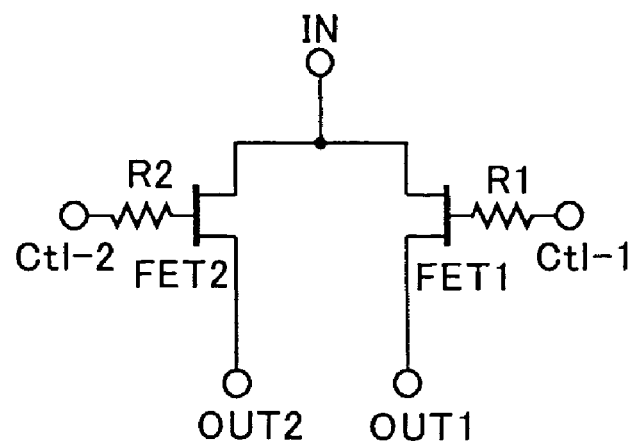
FIGS. 10A and 10B are circuit diagrams for explaining a conventional technology and the present invention.
Figure 10B:
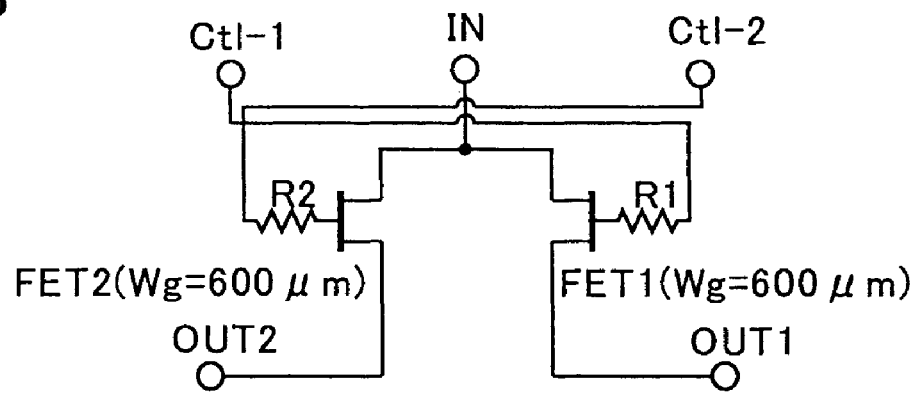
Figure 11A:
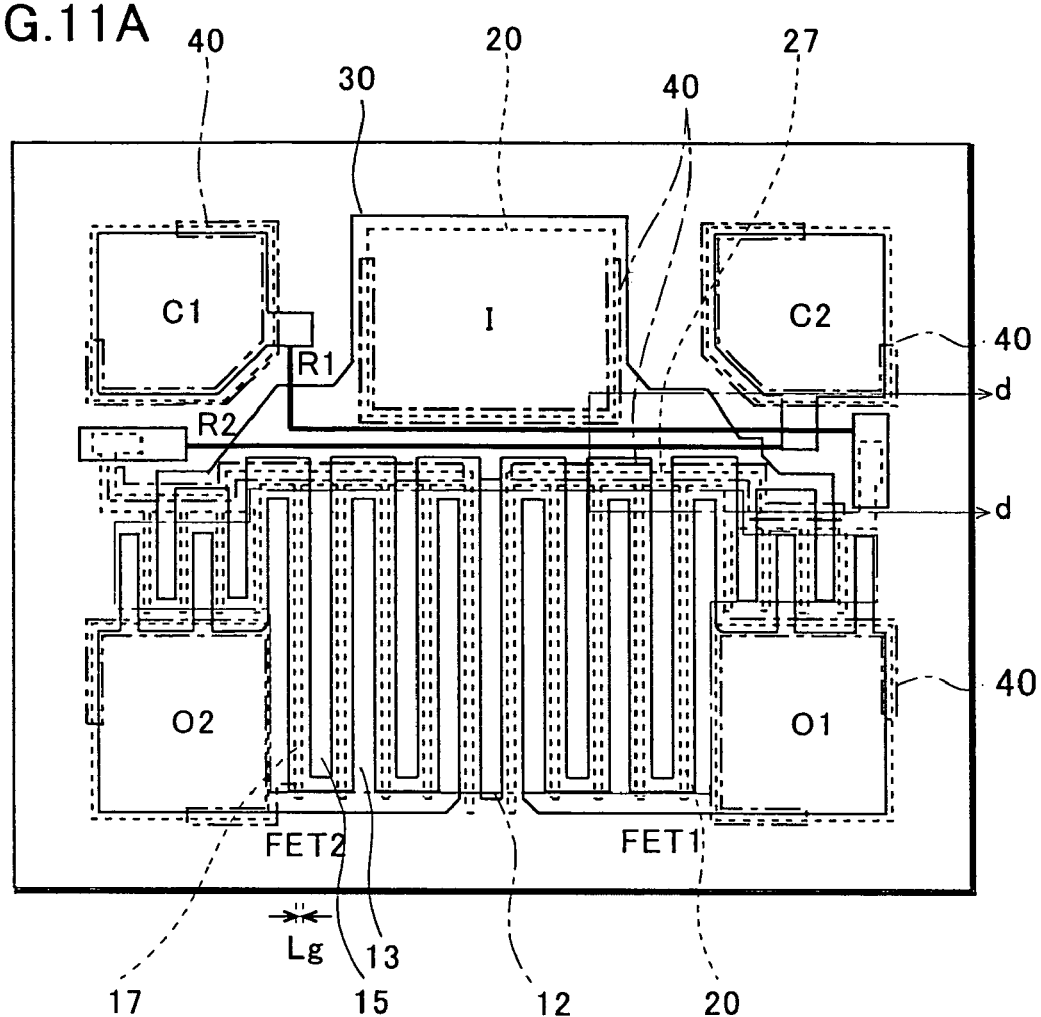
FIGS. 11A and 11B are a plan view and a cross-sectional view for explaining the conventional technology, respectively.
Figure 11B:
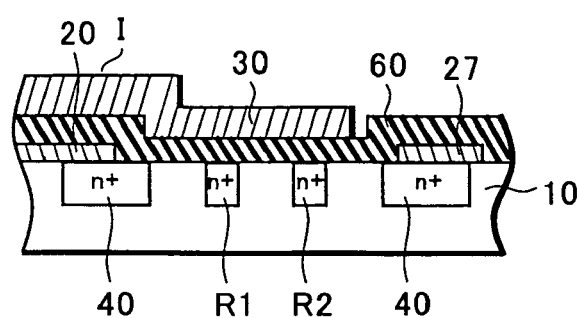

FIG. 1 is a plan view showing the first embodiment. The circuit diagram thereof is the same as that of FIG. 10B, and therefore omitted. The source electrodes (or drain electrodes) of first and second FETs FET1 and FET2 are connected to a common input terminal IN. The gate electrodes of the FET1 and FET2 are connected to first and second control terminals Ctl-1 and Ctl-2 through resistors R1 and R2, respectively. Further, the drain electrodes (or source electrodes) of the FET1 and FET2 are connected to first and second output terminals OUT1 and OUT2, respectively. Control signals which are applied to the first and second control terminals Ctl-1 and Ctl-2 are complementary signals. Of the FET1 and FET2, one to which an H-level signal is applied is turned on, whereby an input high-frequency signal entering the common input terminal IN is transmitted to either one of the output terminals. The resistors R1 and R2 are placed in order to prevent high-frequency signals from leaking through the gate electrodes to the DC potentials of the control terminals Ctl-1 and Ctl-2 which are AC grounded.

Further, the gate electrode of the FET1 is connected to the first control terminal Ctl-1 located far from the FET1, and the gate electrode of the FET2 is connected to the second control terminal Ctl-2 located far from the FET2. Accordingly, in the logic of this switch circuit, when a high-frequency signal is passed to the first output terminal OUT1, a voltage of, for example, 3 V is applied to the first control terminal Ctl-1 far from the first output terminal OUT1, and a voltage of 0 V is applied to the second control terminal Ctl-2. On the other hand, when a high-frequency signal is passed to the second output terminal OUT2, a voltage of 3 V is applied to the second control terminal Ctl-2 located far from the second output terminal OUT2, and a voltage of 0 V is applied to the first control terminal Ctl-1.

As shown in FIG. 1, the FET1 and FET2 which perform switching are placed in a central portion of a GaAs substrate, and the resistors R1 and R2 are connected to gate electrodes 17 of the FETs. Further, pads I, O1, O2, C1, and C2, which respectively correspond to the common input terminal IN, the first and second output terminals OUT1 and OUT2, and the first and second control terminals Ctl-1 and Ctl-2, are provided in the periphery of the substrate and around the FET1 and FET2. Incidentally, a Schottky metal layer indicated by a dotted line is a gate metal layer (Pt/Mo) 20 which is formed simultaneously with the formation of the gate electrodes 17 of the FETs. Note that each of the gate electrodes 17 has a Pt-buried structure to implement an FET in which a higher breakdown voltage and a lower ON resistance are realized compared to gate electrodes made of Ti/Pt/Au. A wiring metal layer indicated by a solid line is a pad metal layer (Ti/Pt/Au) 30 which connects elements and which forms the pads. An ohmic metal layer (AuGe/Ni/Au) is ohmically connected to the substrate, and forms the source and drain electrodes of the FETs and extraction electrodes at both ends of the resistors. In FIG. 1, the ohmic metal layer is not shown because it is overlapped by the pad metal layer.

The gate electrode 17 of the FET1 and the first control terminal Ctl-1 located far from the FET1 are connected by the resistor R1, and the gate electrode 17 of the FET2 and the second control terminal Ctl-2 located far from the FET2 are connected by the resistor R2.

Operating regions 100c are rectangular regions which are surrounded by dashed-dotted lines and in which n-type impurities are ions-implanted into the GaAs substrate. In each of the operating regions 100c, source and drain regions which are made of high concentration n-type impurity regions are selectively formed.

Nine comb-tooth shaped portions of the pad metal layer 30 as the wiring metal layer, which extend toward the chip center, constitute a source electrode 15 (or drain electrode 16) connected to the common input terminal pad I. The source electrode (or the drain electrode 16) formed of the ohmic metal layer which lies under the source electrode 15 (or drain electrode 16), and is in contact with the source region (or drain region). Further, nine comb-tooth shaped portions of the pad metal layer 30 which extend from the chip center toward the outside constitute a drain electrode 16 (or source electrode 15) connected to the first output terminal pad O1. The drain electrode (or source electrode) formed of the ohmic metal layer lies under the drain electrode 16 (or the source electrode 15), and is in contact with the drain region (or source region). Note that center part located between the comb-tooth shaped portions of the source electrodes 15 (or the drain electrodes 16) of the FET1 and FET2 is common to the FET1 and FET2, which part extends from the common input terminal pad I.

The above-described source and drain electrodes are placed in a form in which the comb-tooth shaped portions are engaged. The gate electrode 17 formed of the gate metal layer 20 is placed therebetween to form a shape having 17 comb-tooth shaped portions, and forms a Schottky junction with part of the operating region 100c between the source and drain regions. The gate electrode 17 is connected to the first control terminal pad C1 or second control terminal pad C2 through the gate metal layer (hereinafter referred to as a gate wiring 27) into which the comb-tooth shaped portions are bundled outside the operating region 100c and through the resistor R1 or R2.

Here, the resistors R1 and R2 extend from the FETs, respectively, are n+ type impurity regions $100b1$ and $100b2$ which are provided to intersect, through a nitride film interposed therebetween, a wiring (the pad metal layer 30) connected to the common input terminal pad I. The resistors R1 and R2 are electrically connected to the first and second control terminal pads C1 and C2, respectively.

Further, in order to suppress the spread of a depletion layer extending from each of the pads(I,O1,O2,C1 and C2) to the substrate and hence improve isolation, a peripheral impurity region 100a which is a heavily-doped impurity region is placed around each of the pads. Furthermore, the peripheral impurity region 100a is also placed around each of the gate wirings 27, where the peripheral impurity region 100a is electrically connected to the gate wiring 27.

In this embodiment, conducting regions 120 at floating potentials are placed on the substrate surface between adjacent conducting regions 100 to which predetermined potentials are applied.

Here, in this specification, conducting regions of the GaAs substrate include all regions in which impurities are ion-implanted into the GaAs substrate. Accordingly, the other regions which are not conducting regions are part of a semi-insulating substrate.

Further, the conducting regions include the conducting regions 100 to which predetermined potentials are applied, and the conducting regions 120 (hereinafter referred to as floating conducting regions 120) at floating potentials. The conducting regions 100 to which predetermined potential are applied include the peripheral impurity regions 100a of the pads (and the gate wirings 27), and the resistors 100b. The floating conducting regions 120 are not subjected to any potential, i.e., at floating potentials, and are heavily-doped impurity regions provided in island-like shapes.

That is, as shown in the drawing, for example, the heavily-doped floating conducting regions 120 are respectively placed in the spaces between the peripheral impurity region 100a of the common input terminal pad I and the resistor R1 (100b1), between the resistor R1 (100b1) and the resistor R2 (100b2), between the resistor R2 (100b2) and the operating regions 100c, between the peripheral impurity region 100a of each of the output terminal pads O1 and O2 and the peripheral impurity region 100a of the corresponding gate wiring 27, and between the operating regions 100c of the FET1 and FET2.

Figure 2A:
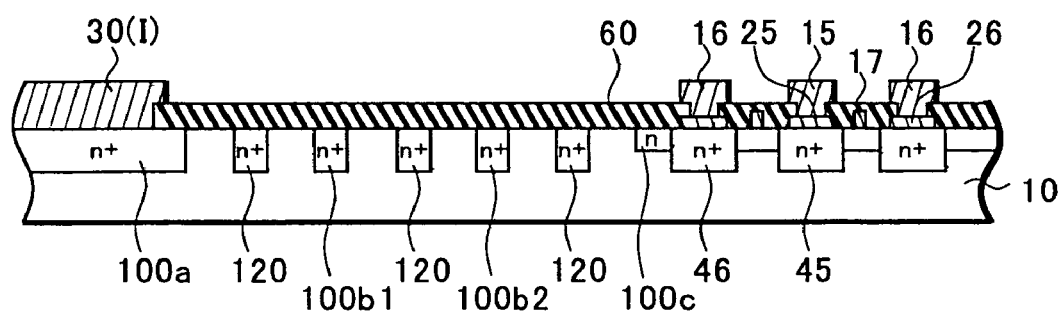
FIGS. 2A to 2C are cross-sectional views for explaining the first embodiment of the present invention.
Figure 2B:
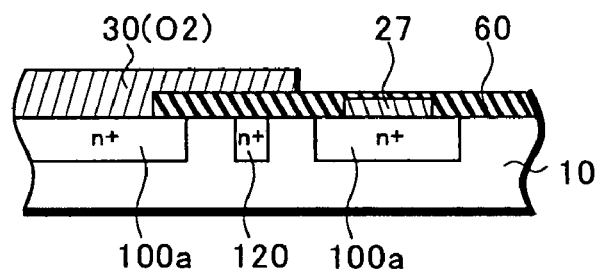
Figure 2C:
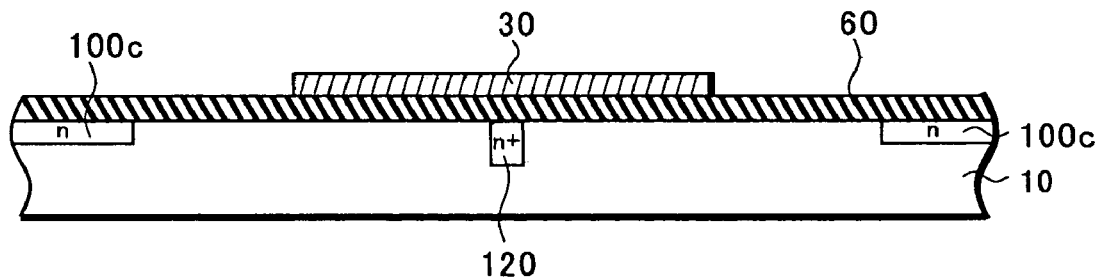

With reference to FIGS. 2A to 2C, a description will be given further. FIG. 2A, FIG. 2B and FIG. 2C are cross-sectional views taken along the a—a line, the b—b line and the c—c line respectively of FIG. 1.

As shown in FIG. 2A, the operating region 100c is a region formed by the ion implantation of impurities (n-type). In the operating region 100c, source and drain regions 45 and 46, which are high concentration n-type impurity regions, are placed by ion implantation similarly. Source and drain electrodes 25 and 26 of the ohmic metal layer and the source and drain electrodes 15 and 16 of the wiring metal layer are connected to the source and drain regions 45 and 46, respectively. The gate electrode 17 forms a Schottky contact to part of the operating region 100c between the source and drain regions 45 and 46.

Further, in order to improve isolation, the peripheral impurity region 100a is placed around each of the pads(I, O1,O2,C1 and C2). Though described in detail later, the peripheral impurity region 100a is electrically connected to the pad metal layer 30 (each of the pads) and provided under each of the pads overall (or around a region under each of the pads) in a manner that it protrudes from each of the pads. Alternatively, the peripheral impurity region 100a may be provided around each of the pads at a distance of approximately 5 µm or less from each of the pads.

For the same reason, as shown in FIG. 2B, the peripheral impurity region 100a is also placed under each of the gate wirings 27, which peripheral impurity region 100a is electrically connected to the gate wiring 27. Also in this case, the peripheral impurity region 100a is provided under the gate wiring 27 overall (or around a region under the gate wiring) in a manner that it protrudes from the wiring, or provided around the wiring at a distance of approximately 5 µm or less therefrom.

Further, in order to realize the logic of reverse control, the resistors 100b1 and 100b2 are placed between the common input terminal pad I and the FET1 and FET2.

Further, in this embodiment, the floating conducting regions 120 are placed on the substrate surface between adjacent the conducting regions 100 to which predetermined potentials are applied.

Each of the floating conducting regions 120 is a high concentration n+ type region (having an impurity concentration of approximately 1 to $5 \times 10^{18}$ cm$^{-3}$), and is not subjected to any potential from the outside, i.e., is at a floating potential. Further, each of the floating conducting regions 120 and each of the conducting regions 100 are separated from each other at a distance (e.g., approximately 4 µm), which ensures that the conducting regions 100 can preserve a predetermined level of isolation, at a distance with the floating conducting region 120 inserted therebetween, whereby can be ensured between the conducting regions 100 which are adjacent across the floating conducting regions 120.

That is, as shown in FIG. 2A, the floating conducting regions 120 are respectively placed in the spaces between the peripheral impurity region 100a of the common input terminal pad I and the resistor 100b1, between the resistors 100b1 and 100b2, and between the resistor 100b2 and the operating region 100c at distances of 4 µm therefrom. An isolation required for a compound semiconductor switch circuit device is 20 dB or more. It has been experimentally confirmed that an isolation of 20 dB or more can be ensured if the distances therebetween are 4 µm. However, in order to prevent even a slight increase in insertion loss, the floating conducting region 120 having a width of, for example, 2 µm is placed at a distance of 4 µm from the conducting region 100, and further, another conducting region 100 is placed at a distance of 4 µm from the floating conducting region 120. The arrangement of the floating conducting regions 120 makes it possible to ensure sufficient level of isolation between the conducting regions 100 which are adjacent across the floating conducting region 120.

Moreover, as shown in FIG. 2B, the floating conducting region 120 is also placed between the peripheral impurity region 100a of the second output terminal pad O2 and the peripheral impurity region 100a of the gate wiring 27. Note that this is the same with respect to the first output terminal pad O1 side (see FIG. 1). Incidentally, in FIG. 2B, the pad O2 is constituted by one layer of the pad metal layer 30. However, applicable structures are not limited to this one, and a structure may be adopted in which the gate metal layer 20 is placed under the pad metal layer 30.

Furthermore, as shown in FIG. 2C, the floating conducting region 120 is placed between the operating region 100c of the FET1 and the operating region 100c of the FET2.

Thus, the floating conducting regions 120 are placed between closely adjacent the conducting regions 100 to which predetermined potentials are applied. This makes it possible to block the extension of depletion layers extending to the substrate by applying the potentials to the conducting regions 100. Accordingly, it is possible to suppress the leakage of high-frequency signals due to the extension of depletion layers to the substrate.

In particular, in the above-described switch circuit device of a reverse control pattern, the resistor R1 connected to the first control terminal pad C1 which is at GND potential at high frequencies is located close to the common input terminal pad I. Accordingly, as shown in FIG. 2A, the floating conducting region 120 is placed between the resistor 100b, which becomes a path for a high-frequency analog signal, and the peripheral impurity region 100a of the common input terminal pad I. This makes it possible to suppress the leakage of high-frequency signals from the common input terminal IN to the first control terminal Ctl-1. Consequently, insertion loss can be reduced. Further, insertion loss can be reduced and the isolation of high-frequency signals can be improved by similarly placing the floating conducting regions 120 between the resistors R1 and R2, between the resistor R2 and the operating region 100c, between each of the pads(I,O1,O2,C1 and C2) and the gate wiring 27, and between the operating regions 100c.

Next, a second embodiment of the present invention will be described with reference to FIG. 3.

Figure 3A:
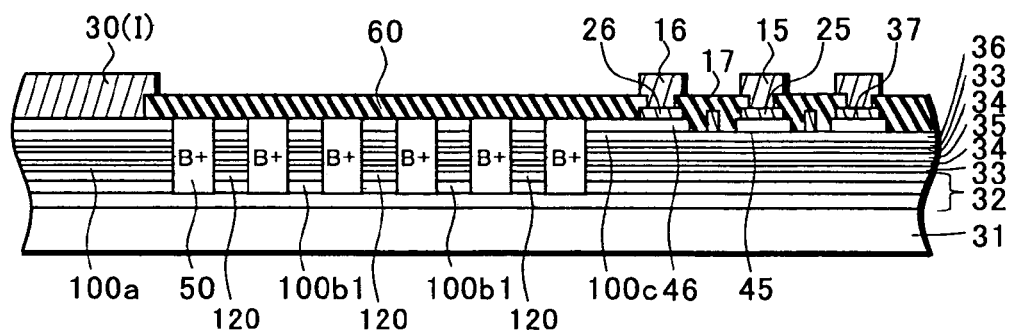
FIGS. 3A to 3C are cross-sectional views for explaining a second embodiment of the present invention.
Figure 3B:
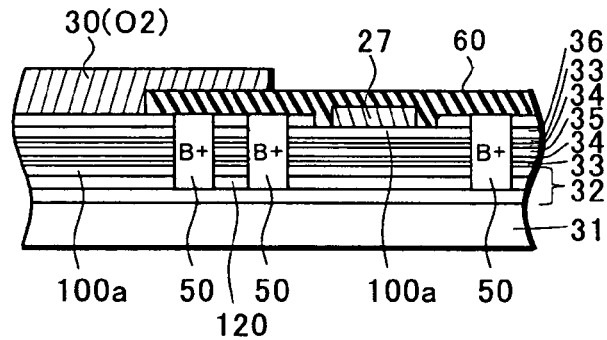
Figure 3C:
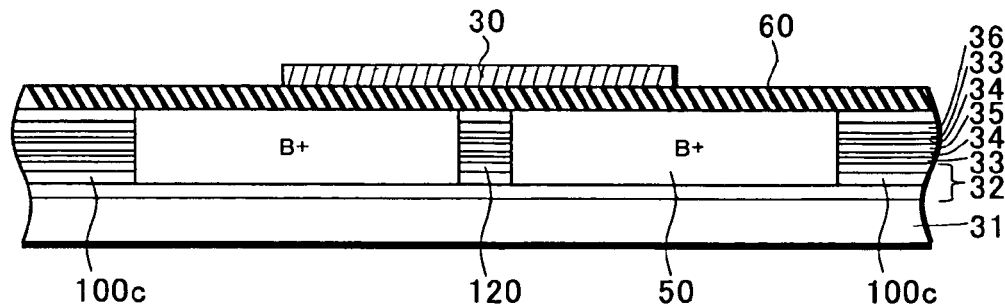

The second embodiment is the case where basic devices are HEMTs, and is provided with a pattern similar to that for the case of GaAs FETs shown in the first embodiment. That is, a plan view thereof is similar to that of FIG. 1 and therefore will not be described. A description will be given with reference to the cross-sectional views of FIGS. 3A to 3C. Note that FIG. 3A is a cross-sectional view taken along the a—a line of FIG. 1, FIG. 3B is a cross-sectional view taken along the b—b line of FIG. 1, and FIG. 3C is a cross-sectional view taken along the c—c line of FIG. 1.

In a HEMT, an undoped buffer layer 32 is deposited on a semi-insulating GaAs substrate 31. In most of the relevant cases, the buffer layer is formed of a plurality of layers. Further, an n+ type AlGaAs layer 33 to serve as an electron-supplying layer, an undoped InGaAs layer 35 to serve as a channel (electron transit) layer, and an n+ type AlGaAs layer 33 to serve as another electron-supplying layer are sequentially deposited on the buffer layer 32. Moreover, a spacer layer 34 is placed between the electron-supplying layer 33 and the channel layer 35.

On the electron-supplying layer 33, an undoped AlGaAs layer 36 to serve as a barrier layer is provided, thus ensuring a predetermined breakdown voltage and pinch-off voltage. Further, an n+ type GaAs layer 37 to serve as a cap layer is provided on the uppermost layer. Connected to the cap layer 37 is a metal layer including pads, source and drain electrodes, and extraction electrodes of resistors. The cap layer 37 is highly concentrated, thus reducing source and drain resistances and improving ohmic characteristics.

In the HEMT, electrons generated from donor impurities of the n+ type AlGaAs layer 33, which is an electron-supplying layer, move to the channel layer 35 side to form a channel serving as a current path. As a result, electrons and donor ions are spatially separated from each other by the heterojunction interface as a boundary. Electrons transit in the channel layer 35. In the channel layer 35, donor ions which cause a decrease in electron mobility do not exist. Accordingly, the influence of Coulomb scattering is very small, and high electron mobility can be obtained.

Further, in the HEMT, a needed pattern is formed by isolating the substrate with insulating regions 50 selectively formed thereon. Here, the insulating regions 50 are not completely electrically insulator but are regions insulated by providing a carrier trap level in an epitaxial layer by ion-implanting impurity (B+). That is, operating regions 100c are formed by isolating the regions surrounded by dashed—dotted lines in FIG. 1 with the insulating regions 50.

Moreover, as shown in FIG. 3A, the operating region 100c, source electrode 25 (or drain electrode 26), which is formed of the ohmic metal layer is connected to the cap layer 37 of the substrate which serves as a source region 45 or a drain region 46. Further, on the uppermost layer, a source electrode 15 (or a drain electrode 16) is formed of a pad metal layer 30.

A gate electrode 17 is formed by etching part of the operating region 100c, i.e., the cap layer 37 between the source region 45 and the drain region 46, and providing a gate metal layer 20, which is the Schottky metal layer, on the undoped AlGaAs layer 36 which is exposed.

Further, around each of the pads(I,O1,O2,C1 and C2) or the gate wirings 27, peripheral impurity regions 100a and resistors 100b1 and 100b2 are formed by isolating the substrate with the insulating regions 50.

Moreover, also in the second embodiment, floating conducting regions at floating potentials (floating conducting regions 120) are placed on the substrate surface between adjacent conducting regions 100 to which predetermined potentials are applied.

Here, in this specification, conducting regions of a HEMT include all regions thereof which are not insulated by B+ implantation. Impurities also exist as an epitaxial layer in the insulating regions 50, but are inactivated by B+ implantation for insulation. That is, in this specification, regions not insulated by B+ implantation are regarded as regions equivalent to conducting regions formed by ion implantation in the first embodiment, and the insulating regions 50 are not regarded as conducting regions.

Further, conducting regions include the conducting regions 100 to which predetermined potentials are applied and the floating conducting regions 120. The conducting regions 100 to which predetermined potentials are applied are the peripheral impurity regions 100a of the pads (or the gate wirings), and resistors 100b. The floating conducting regions 120 are conducting regions which are not subjected to any potential and which are at floating potentials. Further, the structure of each of the floating conducting regions 120 is the same as the epitaxial structure of a HEMT and therefore includes the cap layer 37 (having an impurity concentration of approximately 1 to $5 \times 10^{18}$ cm$^{-3}$). From a functional viewpoint, it can be said that the floating conducting regions are heavily-doped impurity regions.

Moreover, as shown in FIG. 3A, the floating conducting regions 120 are respectively placed in the spaces between the peripheral impurity region 100a of the common input terminal pad I and the resistor 100b1, between the resistors 100b1 and 100b2, and between the resistor 100b2 and the operating region 100c at a distance of 4 μm therefrom.

Furthermore, as shown in FIG. 3B, the floating conducting region 120 is also placed between the peripheral impurity region 100a of the second output terminal pad O2 and the peripheral impurity region 100a of the gate wiring 27. In the case of HEMTs, the undoped AlGaAs layer 36 for ensuring a breakdown voltage and a pinch-off voltage lies directly under the gate electrode 17 or the gate wiring 27, and the conducting region 100 electrically connected to the gate electrode 17 or the gate wiring 27 is the cap layer 37 placed around the gate electrode 17 or the gate wiring 27. The distance therebetween is only approximately 0.2 μm, and it can be said that they are not directly contacted to each other but sufficiently electrically connected. Thus, the conducting region 100 does not need to be directly contacted to a metal layer to which a predetermined potential is applied, but only needs to be electrically connected thereto. Details thereof will be described later.

Incidentally, this is the same with respect to the first output terminal pad O1 side (see FIG. 1). Note that, though a structure having only one layer of the pad metal layer 30 is shown as a pad structure in FIG. 3B, applicable structures are not limited to this one, and a pad having a two-layer structure in which the gate metal layer 20 is placed as a lower layer may be adopted.

Furthermore, as shown in FIG. 3C, the floating conducting region 120 is placed between the operating region 100c of the FET1 (HEMT) and the operating region 100c of the FET2 (HEMT).

In the case of HEMTs, the insertion losses of the basic devices are small compared to those of GaAs FETs. Accordingly, if high-frequency signal paths in the chip have portions where high-frequency signals leak even in a small amount, the insertion loss of the switch circuit device significantly increases.

Moreover, the insulating regions 50 are not completely electrically insulator. Depletion layers extend in the insulating regions 50, and signals leak due to changes of the depletion layers. In such a case, the placement of the floating conducting regions 120 of this embodiment can prevent the leakage of high-frequency signals in high-frequency signal paths, and is therefore very effective in suppressing an increase in insertion loss.

Next, with reference to FIGS. 4A to 5, the types of metal layers connected to the conducting regions 100 to which predetermined potentials are applied will be described.

As described previously, each of the conducting region 100 is electrically connected to any one of each of the pads provided on the substrate and each of the wirings connected to the pads.

Figure 4A:
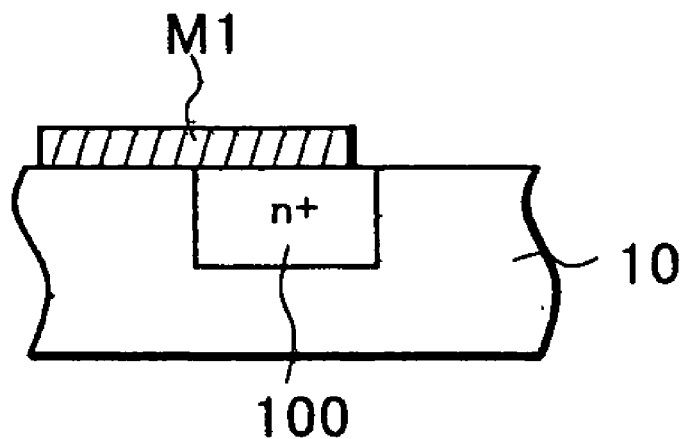
FIGS. 4A to 4C are cross-sectional views for explaining the embodiments of the present invention.
Figure 4B:
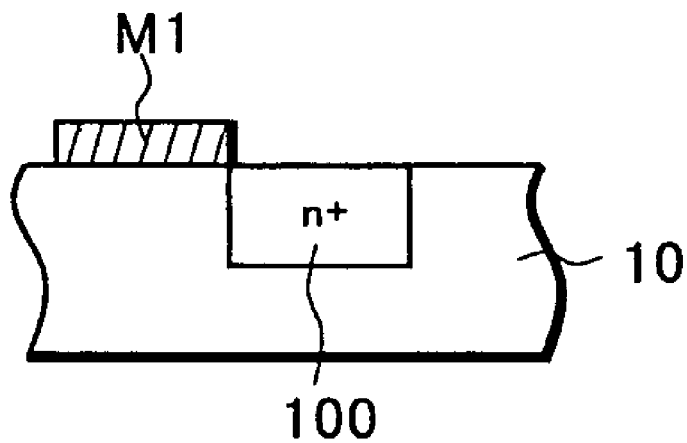
Figure 4C:
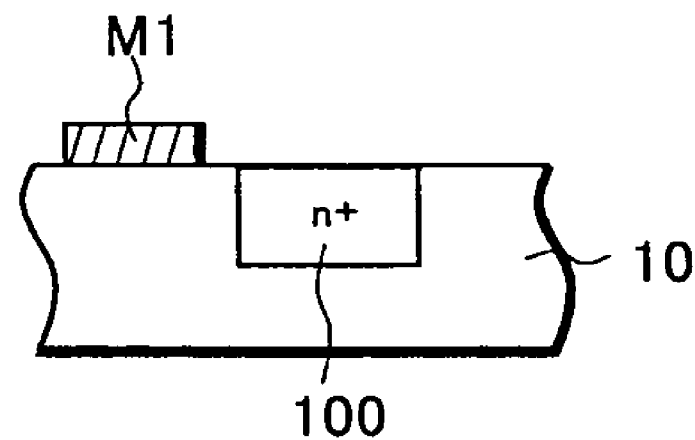

FIGS. 4A to 4C show the cases where the conducting region 100 and a metal layer such as the gate wiring 27 and each of the pads(I,O1,O2,C1 and C2) for example, form a Schottky junction. FIG. 5 shows the case where the conducting region 100 and a metal layer such as the source electrode 25 and the drain electrode 26 for example, form an ohmic junction. Here, for convenience, a metal layer M1 of a Schottky junction and a metal layer M2 of an ohmic junction will be described. Further, a substrate will be described by taking semi-insulating substrate 10 as an example. The same is true on the substrate structure of HEMTs shown in FIGS. 3A to 3C.

FIG. 4A shows the case where the metal layer M1 forms a Schottky junction with the surface of the conducting region 100. The conducting region 100 is the peripheral impurity region 100a, and the metal layer M1 is the pad metal layer 30 (each of the pads) or a gate metal layer 20 (the gate wirings 27).

The metal layer M1 is provided on the surface of the conducting region 100 in line with a position inwardly deviated from an edge portion of the conducting region 100 by 0.1 μm to 5 μm in consideration of a mask alignment precision and a resistance component of the conducting region 100. The metal layer M1 may be provided only on the conducting region 100. This is, for example, a structure in which the conducting region 100 is placed under the pad (wiring) overall.

Further, part of the metal layer M1 may be extended to the semi-insulating substrate 10 to form a Schottky junction with the surface of the substrate 10. For example, this is a structure in which the conducting region 100 is placed around a region under the pad (wiring).

FIGS. 4B and 4C show structures in which the metal layer M1 is not provided on the conducting region 100 but the semi-insulating substrate 10 around the conducting region 100 and the metal layer M1 form a Schottky junction. Thus, a structure may be adopted in which the metal layer M1 is not directly contacted with the conducting region 100 but forms a Schottky junction with the substrate 10 in a position located at a distance of approximately 0 μm to 5 μm from an edge portion of the conducting region 100. For example, as shown in FIG. 4C, the conducting region 100 and the metal layer M1 do not need to be in contact with each other. The conducting region 100 and the metal layer M1 can ensure a sufficient connection through the semi-insulating substrate 10 if the distance therebetween is at 5 μm or less.

Specifically, in such a case where the gate electrode 17 or the gate wiring 27 of the aforementioned HEMT or the peripheral impurity region 100a is placed at a distance of approximately 5 μm from a pad or a wiring, the structure of FIG. 4C is adopted. In the case of the gate wiring 27 of the HEMT, the n+ type GaAs layer 37 is etched under the metal layer M1, and the undoped AlGaAs layer 36 and the metal layer M1 form a Schottky contact. Accordingly, the metal layer M1 and the n+ type GaAs layer 37 peripheral thereof are connected to each other through an epitaxial layer below the n+ type GaAs layer 37 including the undoped AlGaAs layer 36.

Figure 5:
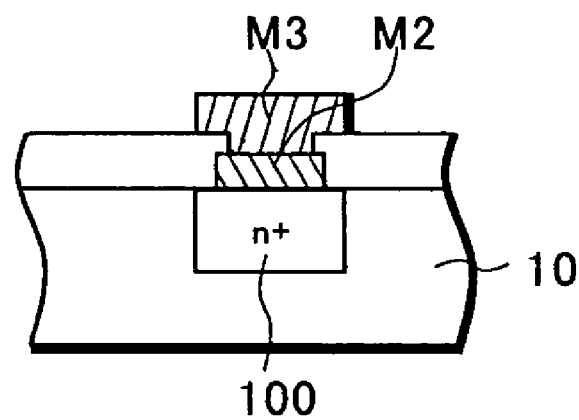
FIG. 5 is a cross-sectional view for explaining the embodiments of the present invention.

On the other hand, FIG. 5 shows the metal layer M2 forming an ohmic junction with the conducting region 100. The conducting region 100 for this case is the source region 45, the drain region 46, or the resistors R1 and R2. The metal layer M2 is the source electrode 25 or the drain electrode 26 which is the ohmic metal layer, or a metal layer for extracting the resistors R1 and R2.

The semi-insulating substrate 10 and the metal layer M2 cannot form an ohmic junction. Accordingly, in this case, the metal layer M2 is not extended on the substrate 10 adjacent thereto. For example, wiring is performed using other metal layer M3 such as the pad metal layer 30.

Figure 6:
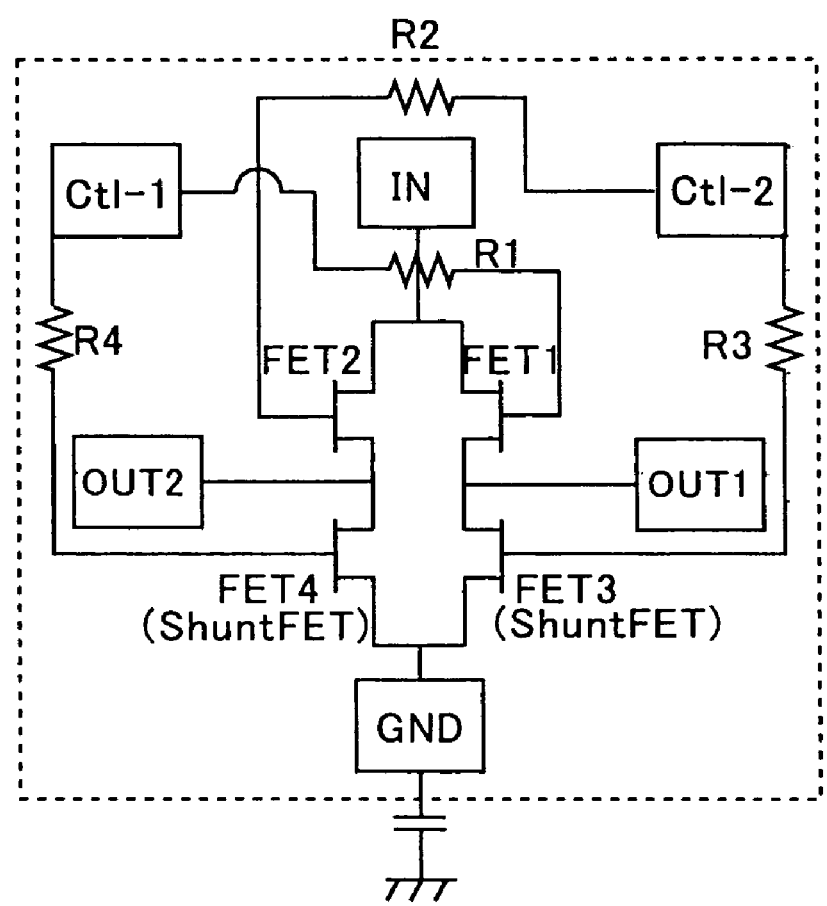
FIG. 6 is a schematic circuit diagram for explaining a third embodiment of the present invention.
Figure 7:
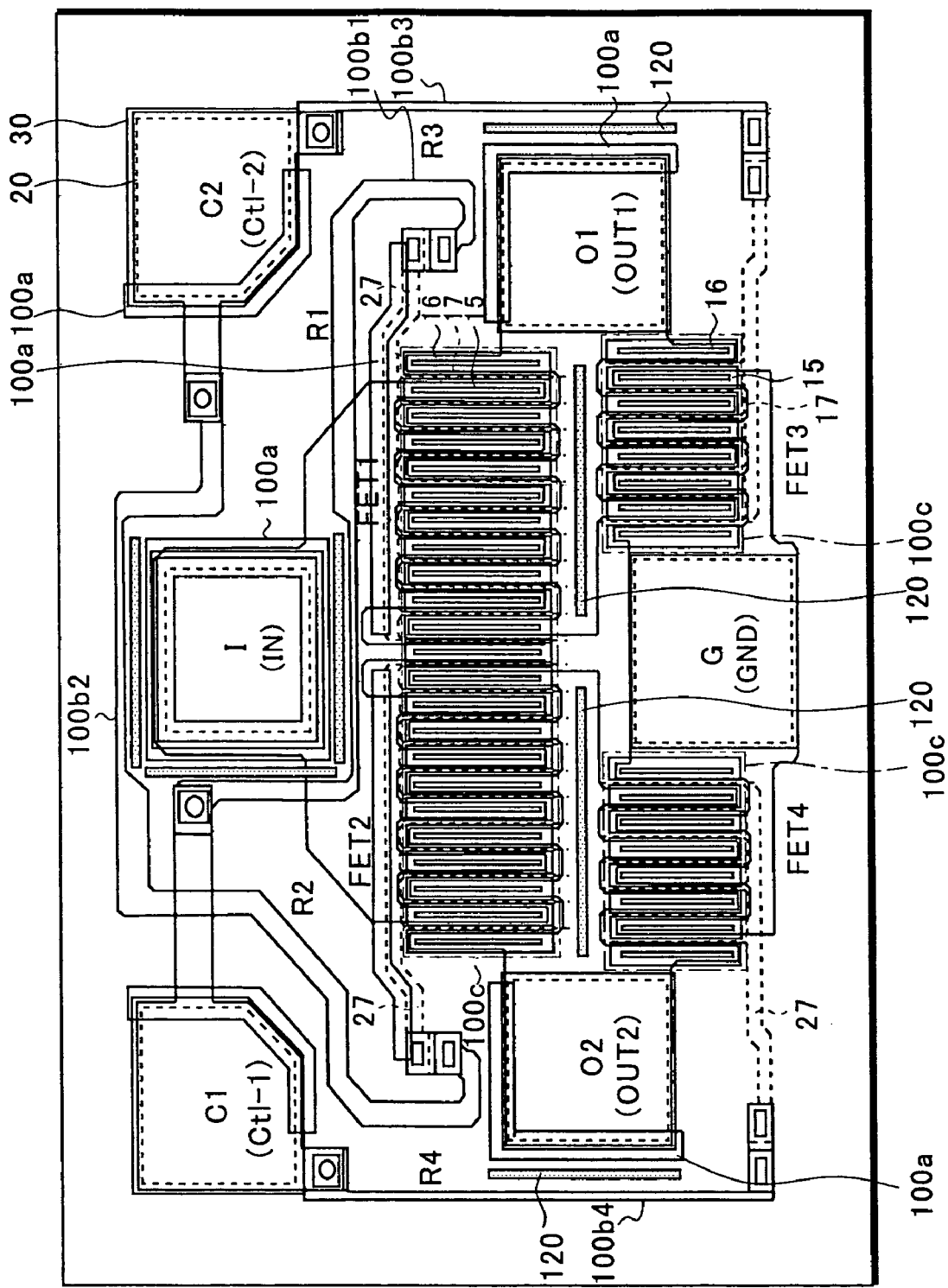
FIG. 7 is a plan view for explaining the third embodiment of the present invention.

A third embodiment of the present invention will be described with reference to FIGS. 6 and 7. The third embodiment has another circuit of the above-described SPDT switch circuit device of a reverse control pattern. FIG. 6 is a schematic circuit diagram. FIG. 7 shows a switch circuit device in which the circuit of FIG. 6 is integrated into one chip.

As shown in FIG. 6, in this circuit, shunt FETs FET3 and FET4 are connected between ground and respective first and second output terminals OUT1 and OUT2 where FETs FET1 and FET2 which perform switching. Complementary signals of second control terminal Ctl-2 and first control terminal Ctl-1, which respectively control the FET2 and FET1, are applied to the gates of the shunt FET3 and shunt FET4, respectively. As a result, when the FET1 is turned on, the shunt FET4 is turned on, but the FET2 and the shunt FET3 are turned off.

In this circuit, in the case where the high-frequency signal path between a common input terminal IN and the first output terminal OUT1 is turned on and the high-frequency signal path between the common input terminal IN and the second output terminal OUT2 is turned off, the shunt FET4 is turned on. Accordingly, an input high-frequency signal leaking toward the second output terminal OUT2 escapes to ground through an external capacitor C which is grounded. Thus, isolation can be improved.

FIG. 7 is a plan view showing one example of a compound semiconductor switch circuit device into which the switch circuit device of FIG. 6 is integrated.

The substrate is a compound semiconductor substrate (e.g., GaAs). The FET1 and FET2 (each having a gate width of 600 μm) which perform switching are placed in the left and right sides of the central portion of the substrate. The shunt FET3 and shunt FET4 (each having a gate width of 300 μm) are placed below the FET1 and FET2. Further, the source electrodes of the shunt FET3 and shunt FET4 are connected to each other to be connected to a ground terminal GND. Resistors R1, R2, R3, and R4 are connected to the gate electrodes of the respective FETs. Electrode pads I, O1, O2, C1, C2, and G, which respectively correspond to the common input terminal IN, the first and second output terminals OUT1 and OUT2, the first and second control terminals Ctl-1 and Ctl-2, and the ground terminal GND, are provided in the periphery of the substrate. Note that the capacitor C for ground is externally connected to the ground terminal GND as shown in FIG. 6.

Incidentally, a Schottky metal layer indicated by a dotted line is a gate metal layer 20 (Ti/Pt/Au) which is formed simultaneously with the formation of the gate electrodes of the FETs, and a wiring metal layer indicated by a solid line is a pad metal layer 30 (Ti/Pt/Au) which connects elements and which forms the pads. An ohmic metal layer (AuGe/Ni/Au) is ohmically connected to the substrate, and forms the source and drain electrodes of the FETs and extraction electrodes at both ends of the resistors. In FIG. 7, the ohmic metal layer is not shown because it is overlapped by the pad metal layer.

An operating region 100c of each of the FETs is an impurity region formed in a region surrounded by a dashed—dotted line. The FET1 uses six comb-tooth shaped portions of the pad metal layer 30 which extend from below (this is similar in the FET2) as a source electrode 15 (or a drain electrode 16) connected to the output terminal pad O1. A source electrode (or drain electrode) formed of the ohmic metal layer lies under the foregoing source electrode 15 (or the drain electrode 16), and is in contact with a source (drain) region in the operating region 100c.

Further, six comb-tooth shaped portions of the pad metal layer 30 which extend from above constitute the drain electrode 16 (or the source electrode 15) connected to the common input terminal pad I. The drain electrode (or the source electrode) formed of the ohmic metal layer under the foregoing drain electrode 16 (or the source electrode 15) is in contact with a drain (source), region in the operating region 100c. The source and drain electrodes 15 and 16 are placed in a form in which their comb-tooth shaped portions are engaged. A gate electrode 17 formed of the gate metal layer 20 is placed therebetween and in a comb-tooth shape, and forms a Schottky junction with part of the operating region 100c.

Moreover, the shunt FET3 uses four comb-tooth shaped portions of the pad metal layer 30 which extend from below (this is similar in the shunt FET4) as the source electrode 15 (or the drain electrode 16) connected to the ground terminal pad G. The source electrode (or the drain electrode) formed of the ohmic metal layer lies under the source electrode 15 (or the drain electrode 16), and is in contact with the source (drain) region in the operating region 100c.

Further, four comb-tooth shaped portions of the pad metal layer 30 which extend from above constitute the drain electrode 16 (or source electrode 15) connected to the first output terminal pad O1. The drain electrode (or the source electrode) formed of the ohmic metal layer under the drain electrode 16 (or the source electrode 15) is in contact with the drain (source) region in the operating region 100c. The source and drain electrodes 15,16 are placed in a form in which their comb-tooth shaped portions are engaged. The gate electrode 17 formed of the gate metal layer 20 is placed therebetween in a comb-tooth shape, and forms a Schottky junction with part of the operating region 100c.

The gate electrode 17 of each FET is bundled into a gate wiring 27 outside the operating region 100c, and connected to the first and second control terminal pad C1 or C2 through one of resistors 100b1 to 100b4, which are impurity regions. Further, each of the pads(I,O1,O2,C1 and C2) and the gate wiring 27 are electrically connected to peripheral impurity regions 100a, respectively.

Further, floating conducting regions 120 at floating potentials are placed on the substrate surface between adjacent conducting regions 100(100a, 100b and 100c) to which predetermined potentials are applied.

Specifically, as shown in FIG. 7, the floating conducting regions 120 are respectively placed in the spaces between the peripheral impurity region 100a of the common input terminal pad I and the resistor 100b2, between the peripheral impurity region 100a of the common input terminal pad I and the resistor 100b1, between the peripheral impurity region 100a of the first output terminal pad O1 and the resistor 100b3, and between the peripheral impurity region 100a of the second output terminal pad O2 and the resistor 100b4.

Further, the floating conducting region 120 is placed between the operating region 100c of the FET1 and FET2, which perform switching operations, and each of the operating regions 100c of the FET3 and FET4, which are shunt EFTs and placed as opposed to the FET1 and FET2. Note that the floating conducting regions 120 between the FETs may be continuous under the wiring connected to the GND terminal pad G.

In particular, in the pattern of FIG. 7, adjacent portions of the common input terminal pad I and the resistors R1 and R2 connected to the first and second control terminal pads C1 and C2, respectively, which are at GND potential at high frequencies, are long. It is therefore considered that the leakage of high-frequency signals in these portions greatly affects insertion loss. However, an increase in insertion loss can be suppressed by placing the conducting impurity regions 120.

Incidentally, a description has been given by taking as an example the case where basic devices are GaAs FETs. However, the same is true in the case where basic devices are HEMTs. That is, the conducting regions 100 and the floating conducting regions 120 shown in FIG. 7 are formed by isolating the substrate with insulating regions 50 as in the second embodiment.

Furthermore, a fourth embodiment will be described with reference to FIGS. 8 and 9.

The fourth embodiment is a switch circuit device for high-power application in which a plurality of stages of FETs are connected in series.

Figure 8:
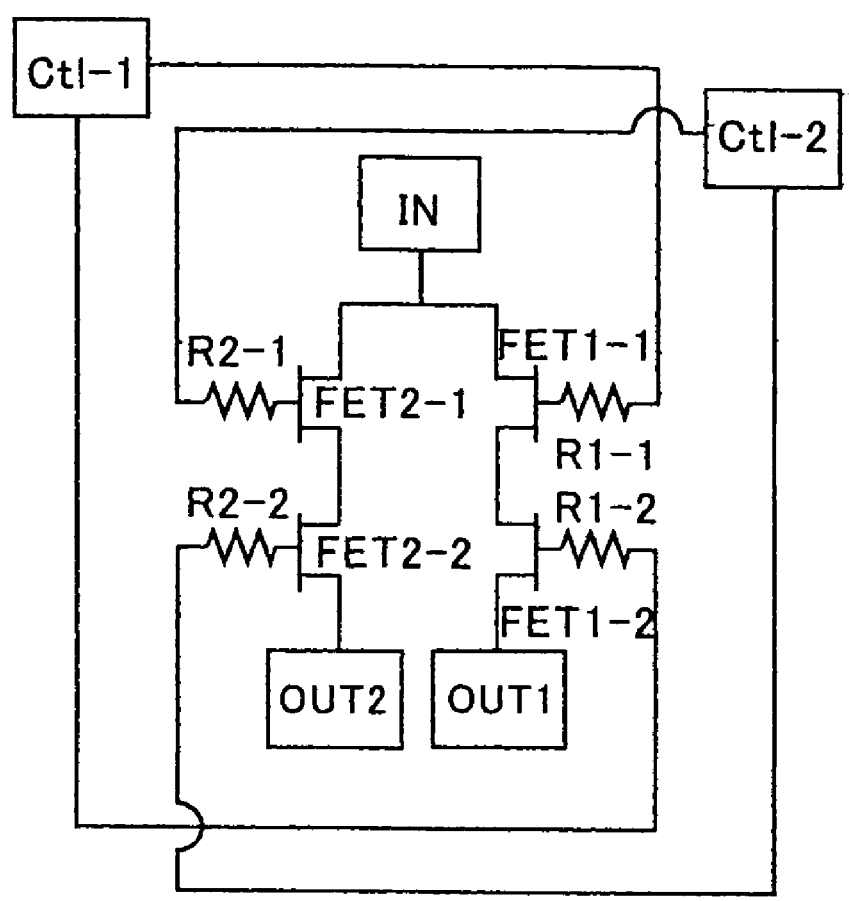
FIG. 8 is a schematic circuit diagram for explaining a fourth embodiment of the present invention.

FIG. 8 is a circuit diagram showing one example of a multistage-connection compound semiconductor switch circuit device. This switch circuit device is also an SPDT switch. There are five external terminals: a common input terminal IN, first and second output terminals OUT1 and OUT2, and first and second control terminals Ctl-1 and Ctl-2.

As shown in FIG. 8, the switch circuit device includes first and second FET groups F1 and F2, each of which has, for example, two stages of FETs connected in series. Further, a source electrode (or a drain electrode) of an FET FET1-1 of the first FET group F1 and a source electrode (or a drain electrode) of an FET FET2-1 of the second FET group F2 are connected to the common input terminal IN. The gate electrodes of the two FETs of the first FET group F1 are connected to the first control terminal Ctl-1 through respective resistors. The gate electrodes of the two FETs of the second FET group F2 are connected to the second control terminal Ctl-2 through respective resistors.

Furthermore, the drain electrode (or the source electrode) of the FET1-2 of the first FET group F1 is connected to the first output terminal OUT1, and the drain electrode (or the source electrode) of the FET2-2 of the second FET group F2 is connected to the second output terminal OUT2. Control signals applied to the first and second control terminals Ctl-1 and Ctl-2 are complementary signals. Of the FET groups, one to which an H-level signal is applied is turned on, and an input high-frequency signal entering the common input terminal IN is transmitted to either one of the output terminals. The resistors are placed in order to prevent high-frequency signals from leaking through the gate electrodes to DC potentials of the first and second control terminals Ctl-1 and Ctl-2 which are AC grounded.

Figure 9:
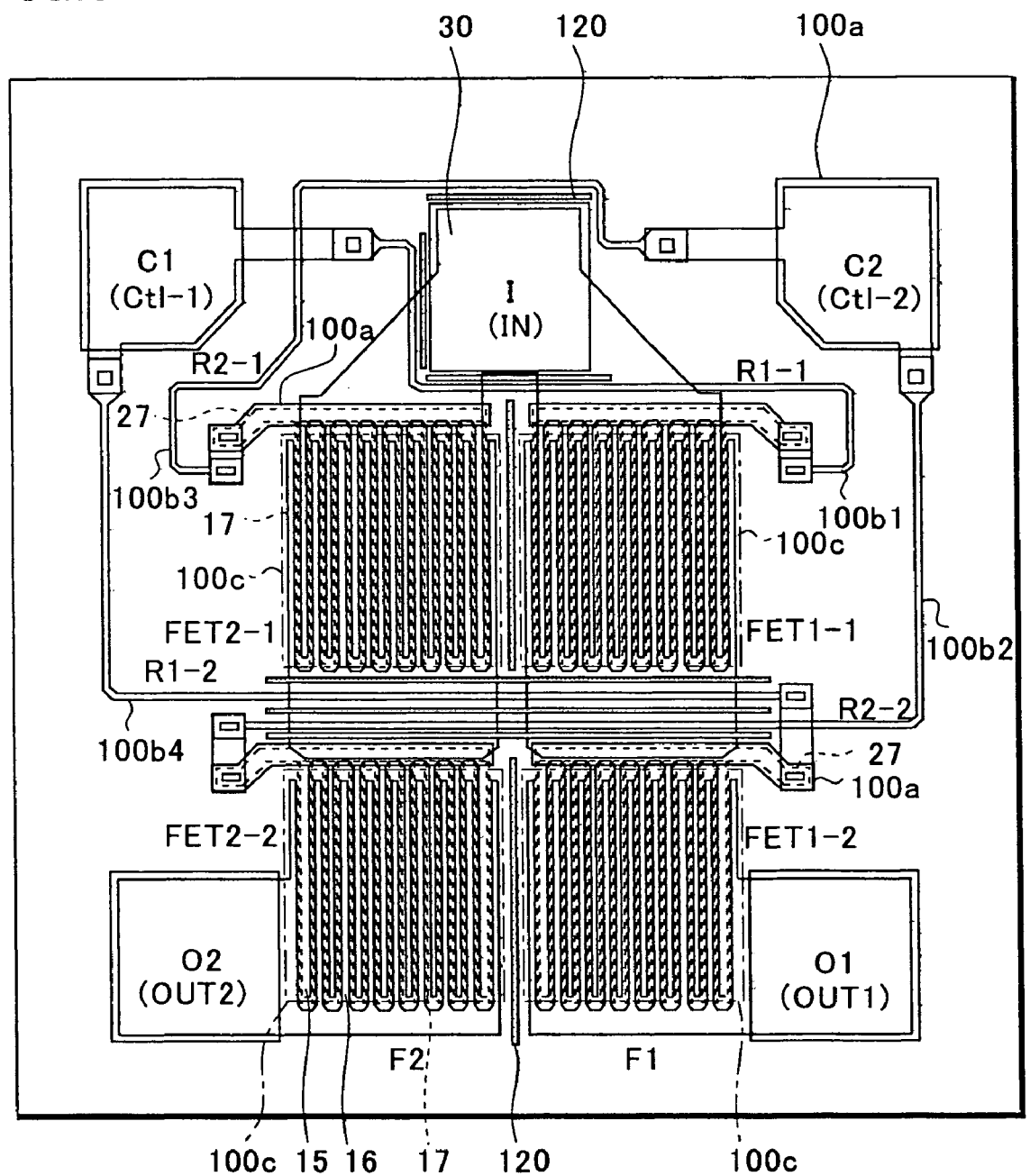
FIG. 9 is a plan view for explaining the fourth embodiment of the present invention.

FIG. 9 shows one example of a compound semiconductor chip into which this compound semiconductor switch circuit device is integrated.

The two FET groups F1 and F2, which perform switching, are placed on a GaAs substrate. In the FET group F1, for example, the FET1-1 and FET1-2 are connected in series. In the FET group F2, the FET2-1 and FET2-2 are connected in series. Resistors R1-1, R1-2, R2-1, and R2-2 made of impurity regions 100b1 to 100b4 are connected respectively to the four gate electrodes of the FET groups. Further, electrode pads I, O1, O2, C1, and C2, which correspond respectively to the common input terminal IN, the first and second output terminals OUT1 and OUT2, and the first and second control terminals Ctl-1 and Ctl-2, are provided in the periphery of the substrate. Incidentally, a Schottky metal layer indicated by a dotted line is a gate metal layer (Pt/Mo) 20 which is formed simultaneously with the formation of the gate electrode of each of the FETs, and a wiring metal layer indicated by a solid line is a pad metal layer (Ti/Pt/Au) 30 which connects each elements and which forms the pads. An ohmic metal layer (AuGe/Ni/Au) is ohmically connected to the substrate, and forms the source and drain electrodes of each of the FETs and extraction electrodes at both ends of each of the resistors. However, in FIG. 9, the ohmic metal layer is not shown because it is overlapped by the pad metal layer.

The FET groups F1 and F2 are placed to be symmetric with respect to the center line of the chip, and have the same constitution. Accordingly, the FET group F1 will be described below. An operating region 100c is an impurity region formed in a region indicated by a dashed—dotted line. The FET1-1 uses eight comb-tooth shaped portions of the pad metal layer 30 which extend from above as a source electrode 15 (or a drain electrode 16) connected to the common input terminal pad I. The source electrode (or the drain electrode) formed of the ohmic metal layer lies under the source electrode 15 (or the drain electrode 16), and is in contact with a source (drain) region in the operating region 100c.

Further, nine comb-tooth shaped portions of the pad metal layer 30, which extend from below, form the drain electrode 16 (or the source electrode 15) of the FET1-1. The drain electrode (or the source electrode) formed of the ohmic metal layer under the drain electrode 16 (or the source electrode 15) is in contact with the drain (source) region in the operating region 100c. The source and drain electrodes 15,16 are placed in a form in which the comb-tooth shaped portions thereof are respectively engaged. A gate electrode 17 formed of the gate metal layer 20 is placed therebetween in a shape having 16 comb-tooth shaped portions, and forms a Schottky junction with part of the operating region 100c.

The gate electrode 17 is bundled into a gate wiring 27 outside the operating region 100c, and connected to the first control terminal pad C1 located far from the FET1-1 through the resistor 100b1 formed of an impurity region. Further, the gate electrode 17 of the FET1-2 is connected to the first control terminal pad C1 through the resistor 100b4 extending between the FET1-1 and FET1-2. Further, peripheral impurity regions 100a are provided in the vicinity of the gate wirings 27 and each of the pads(I,O1,O2,C1 and C2).

Further, floating conducting regions 120 are respectively placed in the spaces between the peripheral impurity region 100a of the common input terminal pad I and the resistor 100b1, and between the peripheral impurity region 100a of the common input terminal pad I and the resistor 100b3 in the manner that the respective floating conducting regions 120 are at distances of at least 4 μm from these peripheral impurity regions 100a and these resistors 100b.

Moreover, the floating conducting region 120 is placed between the operating regions 100c of the FET1-1 and FET2-1. Further, a floating conducting region 120 is placed between the operating regions 100c of the FET1-2 and FET2-2.

Furthermore, the floating conducting regions 120 are placed between the resistor 100b4 and each of the operating regions 100c of the FET 1-1 and FET2-1, between the resistors 100b2 and 100b4, and between the resistor 100b2 and each of the operating regions 100c of the FET1-2 and FET2-2.

This makes it possible to prevent the leakage of high-frequency signals and suppress an increase in insertion loss in regions where the operating regions 100c, the peripheral impurity regions 100a, and the resistors 100b1 to 100b4 are closely placed.

Incidentally, a description has been given by taking as an example the case where basic devices are GaAs FETs. However, the same is true in the case where basic devices are HEMTs. That is, the conducting regions 100 and the floating conducting regions 120 shown in FIG. 9 are formed by isolating the substrate with insulating regions 50 as in the second embodiment.

That is, in the case of GaAs FETs, there may be a combination of resistors having different sheet resistances resulting from different ion implantation conditions such as doses and acceleration voltages. In the case of HEMTs, there may be a combination of resistors with and without the cap layer 37. All of the resistors are conducting regions 100 to which predetermined potentials are applied. In the case where these conducting regions are closely located, the isolation of high-frequency signals can be improved by placing floating conducting regions 120 therebetween.

Incidentally, epitaxial structures of HEMTs are not limited to the aforementioned ones. The embodiments of the present invention can also be similarly carried out in the case of an epitaxial structure in which an undoped AlGaAs layer 36 and an n+ type GaAs layer 37 are further repeatedly provided between the cap layer 37 and the barrier layer 36.

As described above, the embodiments of the present invention provides a number of effects including the followings First, in the embodiment of the present invention, a heavily-doped impurity region at a floating potential is provided on the surface of a substrate between adjacent conducting regions electrically connected to any one of metal layers to which predetermined potentials are applied. This makes it possible to block a depletion layer extending from the conducting regions to which predetermined potentials are applied to the substrate. Thus, the leakage of high-frequency signals therebetween can be suppressed.

Second, the metal layers are electrode pads or wirings connected to the pads. The conducting regions to which predetermined potentials are applied are regions for ensuring a predetermined level of isolation in the vicinities of the metal layers. According to the embodiment of the present invention, it is possible to further suppress a deterioration in isolation which results from the proximity of the conducting regions to each other, the conducting regions to which predetermined potentials are applied.

Third, in a switch circuit device having a plurality of FETs, a heavily-doped impurity region at a floating potential is provided on the surface of a substrate between adjacent conducting regions to which predetermined potentials are applied and which are electrically connected to any one of pads to which predetermined potentials are applied and wirings connected to the pads. This makes it possible to block a depletion layer extending to the substrate between the adjacent conducting regions. Accordingly, in a switch circuit device in which the operating regions of FETs and pads or wirings are closely located, it is possible to suppress the leakage of high-frequency signals in a region where conducting regions are closely located.

Fourth, at least one part of adjacent ones of the conducting regions to which predetermined potentials are applied is a connection between a control terminal and an FET. Accordingly, the leakage of high-frequency signals to the control terminal which is at GND potential at high frequencies can be prevented by providing an conducting region at a floating potential between the foregoing conducting regions.

Fifth, one part of adjacent ones of the conducting regions to which predetermined potentials are applied is placed under a common input terminal pad or around the pad, and another part thereof is a connection connected to a control terminal pad. It is possible to effectively prevent the leakage of high-frequency signals between the common input terminal pad to which a high-frequency signal is inputted and the control terminal pad which is at GND potential at high frequencies. Consequently, an increase in insertion loss can be suppressed.

Sixth, at least part of the connection is a resistor, and the leakage of high-frequency signals can be prevented using the conducting region at a floating potential. Accordingly, the common input terminal pad and the resistor connected to the control terminal pad can be closely placed. This makes it possible to effectively prevent the leakage of high-frequency signals in a reverse control pattern in which resistors are lied around long distance in a chip.

Seventh, at least one part of the conducting regions to which predetermined potentials are applied is the operating region of an FET. Accordingly, it is possible to prevent the leakage of high-frequency signals caused by a depletion layer extending from the FET to the substrate.

Eighth, the gate electrode of an FET of a switch circuit device is connected to a first or second control terminal pad located far from the FET. A connection therebetween is placed in the vicinity of the common input terminal pad. That is, in a switch circuit device of reverse control in which a resistor as a connection is placed between the common input terminal pad and the FET to suppress an increase in a chip area, the leakage of high-frequency signals between the common input terminal and the resistor which are closely located can be prevented. Consequently, an increase in insertion loss can be suppressed.

Ninth, the FETs are HEMTs having small insertion losses of basic devices themselves, and an MMIC can be formed in which low insertion loss characteristics of HEMTs are sufficiently utilized by preventing even a small leakage of high-frequency signals in a pattern shape.

Tenth, at least one part of adjacent conducting regions is originally a region for ensuring isolation around pads of a switch circuit device. Heretofore, there are cases where a small leakage of high-frequency signals is caused by the proximity of this region for ensuring isolation to a conducting region to which a potential is applied. However, according to the embodiment of the present invention, even a small leakage of high-frequency signals can be suppressed.

Eleventh, at least one of conducting regions to which predetermined potentials are applied is a region for ensuring isolation around wirings of a switch circuit device. Accordingly, a predetermined level of isolation can be ensured. Consequently, an increase in insertion loss can be suppressed.

Twelfth, conducting regions to which predetermined potentials are applied and conducting regions at floating potentials are placed apart from each other at distances in which a predetermined isolation can be ensured between conducting regions to which predetermined potentials are applied and which are adjacent to each other across a conducting region at a floating potential. Accordingly, isolation can be sufficiently ensured. Consequently, an increase in insertion loss can be suppressed.

What is claimed is:

1. A semiconductor device comprising:
   a compound semiconductor substrate;
   a first field effect and a second field effect transistor, each of the transistors being formed on the substrate and comprising an operating region and a gate electrode, a source electrode and a drain electrode that are connected with the operating region;
   a common input terminal pad connected with the source or drain electrode of the first transistor and connected with the source or drain electrode of the second transistor;
   a first output terminal pad connected with the source or drain electrode of the first transistor that is not connected with the common input terminal pad;
   a second output terminal pad connected with the source or drain electrode of the second transistor that is not connected with the common input terminal pad;
   a first control terminal pad;
   a first electric connection connecting the first control terminal pad and the gate electrode of the first transistor;
   a second control terminal pad;
   a second electric connection connecting the second control terminal pad and the gate electrode of the second transistor;
   a conducting region disposed in or on the substrate that is in electric contact with one of the common input terminal pad, the first and second output terminal pads and the first and second control terminal pads, or a wiring connected with one of the common input terminal pad, the first and second output terminal pads and the first and second control terminal pads, or a wiring connected with one of the operating regions; and
   floating conducting region that is configured not to receive any electric potential, the floating conducting region being disposed between one of the operating regions and the conducting region, between the operating region of the first transistor and the operating region of the second transistor, between one of the first and second electric connections and one of the operating regions, between the first and second electric connections or between the common input terminal pad and one of the first and second electric connections.

2. The semiconductor device of claim 1, further comprising additional conducting region disposed in or on the substrate that is in electric contact with one of the common input terminal pads, the first and second output terminal pads and the first and second control terminal pads, or a wiring connected with one of the common input terminal pads, the first and second output terminal pads and the first and second control terminal pads, or a wiring connected with one of the operating regions, and additional floating conducting region that is disposed between the conducting region and the additional conducting region.

3. The semiconductor device of claim 1, wherein each of the first and second electric connections comprises a resistor.

4. The semiconductor device of claim 1, wherein the first control terminal pad is placed closer to the second transistor than the first transistor, and the second control terminal pad is placed closer to the first transistor than the second transistor.

5. The semiconductor device of claim 1, wherein each of the transistors comprises a high electron mobility transistor.

6. The semiconductor device of claim 1, wherein the conducting region is placed away from a corresponding terminal pad to an extent that an electric contact is maintained through a Schottky contact.

7. The semiconductor device of claim 1, wherein the conducting region is placed away from a corresponding wiring to an extent that an electric contact is maintained through a Schottky contact.

8. The semiconductor device of claim 1, further comprising an additional conducting region disposed in or on the substrate that is in electric contact with one of the common input terminal pad, the first and second output terminal pads and the first and second control terminal pads, or a wiring connected with one of the common input terminal pad, the first and second output terminal pads and the first and second control terminal pads, or a wiring connected with one of the operating regions, wherein the floating conducting region is disposed between the conducting region and the additional conducting region or between the operation region and the conducting region to maintain a proper isolation.

9. The semiconductor device of claim 1, wherein the conducting region and the floating conducting region are formed in portions of the compound semiconductor substrate that are semi-insulating.

10. The semiconductor device of claim 1, wherein the conducting region and the floating conducting region are portions of conducting semiconductor layers formed on the compound semiconductor substrate that are defined by impurity-implanted insulating regions formed in the semiconductor layers.

11. The semiconductor device of claim 1, the floating conducting region is configured to suppress an expansion of a depletion layer from a corresponding conducting region.

12. The semiconductor device of claim 1, wherein the common input terminal pad is configured to receive a high-frequency analog signal.

* * * * *